(12) United States Patent
Iwamizu et al.

(10) Patent No.: US 9,490,793 B2
(45) Date of Patent: Nov. 8, 2016

(54) INSULATED-GATE TYPE DEVICE DRIVING CIRCUIT

(71) Applicant: FUJI ELECTRIC CO., LTD., Kawasaki-shi (JP)

(72) Inventors: Morio Iwamizu, Matsumoto (JP); Shinji Yamashina, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 16 days.

(21) Appl. No.: 14/621,376

(22) Filed: Feb. 12, 2015

(65) Prior Publication Data

US 2015/0263719 A1 Sep. 17, 2015

(30) Foreign Application Priority Data

Mar. 13, 2014 (JP) .................. 2014-050129

(51) Int. Cl.
| | |
|---|---|
| *H03B 1/00* | (2006.01) |
| *H03K 17/0412* | (2006.01) |
| *H01L 27/06* | (2006.01) |
| *H01L 27/088* | (2006.01) |
| *H03K 17/687* | (2006.01) |
| *H01L 21/8234* | (2006.01) |

(52) U.S. Cl.
CPC ..... *H03K 17/04123* (2013.01); *H01L 27/0629* (2013.01); *H01L 27/0883* (2013.01); *H03K 17/687* (2013.01); *H01L 21/823487* (2013.01)

(58) Field of Classification Search
USPC ............... 327/108–112, 365–508, 534–537; 326/22–27, 81–87
See application file for complete search history.

(56) References Cited

U.S. PATENT DOCUMENTS

| | | | | |
|---|---|---|---|---|
| 6,005,378 | A * | 12/1999 | D'Angelo | G05F 3/242 323/273 |
| 6,194,884 | B1 * | 2/2001 | Kesler | G05F 3/222 323/285 |
| 8,861,175 | B2 * | 10/2014 | Godo | F23Q 3/004 361/263 |
| 2004/0200463 | A1 * | 10/2004 | Ando | F02P 11/06 123/630 |
| 2008/0303588 | A1 * | 12/2008 | Aota | G11O 5/147 327/546 |
| 2012/0038392 | A1 * | 2/2012 | Iwamizu | H03K 17/04123 327/109 |

FOREIGN PATENT DOCUMENTS

| | | |
|---|---|---|
| JP | 2008-067593 A | 3/2008 |
| JP | 2012-034079 A | 2/2012 |

* cited by examiner

*Primary Examiner* — Brandon S Cole
(74) *Attorney, Agent, or Firm* — Rabin & Berdo, P.C.

(57) ABSTRACT

An insulated-gate type device driving circuit for driving an insulated-gate semiconductor element based on a gate signal inputted from the outside includes a gate voltage control semiconductor element which is connected between a gate and a source of the insulated-gate semiconductor element, and a pull-up element which is constituted by a depletion type MOSFET connected between a gate and a drain of the gate voltage control semiconductor element. The gate voltage control semiconductor element is driven by a voltage applied to the gate of the insulated-gate semiconductor element, and a back gate of the MOSFET constituting the pull-up element is grounded to prevent a parasitic transistor from being formed.

11 Claims, 13 Drawing Sheets

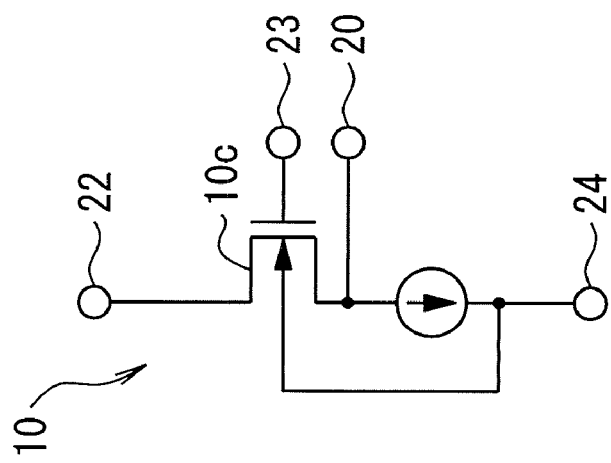
FIG. 2C
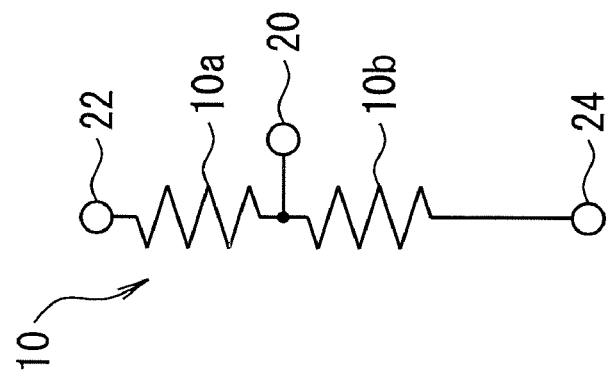
FIG. 2B
FIG. 2A

INSULATED-GATE TYPE DEVICE DRIVING CIRCUIT

CROSS-REFERENCE TO RELATED APPLICATION

This application is based on, and claims priority to, Japanese Patent Application No. 2014-050129, filed on Mar. 13, 2014, contents of which are incorporated herein by reference.

BACKGROUND OF THE INVENTION

1. Field of the Invention

The present invention relates to an insulated-gate type device driving circuit. Particularly, it relates to an insulated-gate type device driving circuit which can prevent an insulated-gate type device from being turned ON by mistake and which can perform an operation to turn OFF the insulated-gate type device at a high speed.

2. Description of the Background Art

As an insulated-gate type device driving circuit according to the background art, proposed is a configuration in which a current source circuit is provided, for example, to discharge a gate capacitance of a semiconductor switch element in order to turn OFF a current flowing into a main terminal of the semiconductor switch element, and a current regulation circuit is further provided to gradually decrease a current value for discharging the gate capacitance in accordance with the increase of a voltage between opposite ends of the main terminal of the semiconductor switch element so that both a surge voltage and a turn-OFF loss can be reduced (for example, see JP-A-2008-67593).

However, no measure against sudden increase in power supply when a power MOSFET is in an OFF state has been taken in the background-art example described in JP-A-2008-67593. Therefore, in such a situation, the power MOSFET which is in an OFF state may be turned ON by mistake due to a current flowing into a gate of the power MOSFET through a parasitic capacitance between the gate and a drain of the power MOSFET. In order to cope with this problem, it is necessary to keep an output current of the current source circuit at a predetermined current value or higher whenever the power MOSFET is turned OFF.

Since a voltage applied to the gate terminal is pulled down in this case, there arises a problem that the gate voltage of the power MOSFET in a normal ON state is decreased to cause decrease in the current conduction capacity of the power MOSFET (increase in Ron) or increase in current consumption.

In order to solve the problem of the background-art example described in JP-A-2008-67593, the present applicant has proposed a configuration shown in JP-A-2012-34079.

That is, in a background-art example described in JP-A-2012-34079, a semiconductor integrated circuit device 1 as a load drive control element is connected to one end of a load 3 such as a resistance load or an inductive load, while the other end of the load 3 is connected to a power supply 2, as shown in FIG. 12.

Input/output terminals of the semiconductor integrated circuit device 1 to the outside include three terminals, i.e. a drain terminal 4, a gate terminal 5 and a source terminal 6. The drain terminal 4 is connected to the one end of the load 3. The source terminal 6 is connected to the ground. In addition, a gate signal is inputted to the gate terminal 5 from the outside. The semiconductor integrated circuit device 1 is constituted by a drive circuit portion 17 and a power portion 18. The power portion 18 includes a power MOSFET (insulated-gate semiconductor element) 8 which is controllably turned ON/OFF by the drive circuit portion 17.

A Zener diode 9 is connected between the gate terminal 5 of the semiconductor integrated circuit device 1 and a ground potential (source potential) 24.

In addition, a current detecting sensor 10 is connected between a drain potential 22 and the ground potential 24. Further, a logic circuit (threshold control circuit) 12 is connected between the gate terminal 5 and the ground potential 24. A temperature detecting sensor 11 is connected between the logic circuit 12 and the ground potential 24.

As shown in FIG. 12, the logic circuit 12 has an N-type depletion MOSFET 12$x$, a diode 12$y$ and an N-type enhancement MOSFET 12$z$. Further, a gate resistor 13 is connected between a gate of a power MOSFET 8 and the gate terminal 5.

Further, a p NMOSFET (gate voltage control semiconductor element) 14 is connected between a gate potential 23 and the ground potential 24 of the power MOSFET (insulated-gate semiconductor element) 8. An N-type depletion MOSFET 25 is connected as a pull-up element between a drain and a gate of the gate voltage control NMOSFET 14.

In addition, a gate voltage control circuit 15 is connected between the gate potential 23 and the ground potential 24. An input terminal of the gate voltage control circuit 15 is connected to an output terminal of the current detecting sensor 10.

Further, a constant current source 16 is connected between the gate potential 23 and the ground potential 24. This constant current source 16 is provided to pull down the gate potential 23 in order to prevent the power MOSFET 8 from being turned ON due to noise going into the gate terminal 5.

With the configuration made thus, a current supplied through a parasitic capacitance between the gate and a drain of the insulated-gate semiconductor element 8 is used as a power source to turn ON the gate voltage control semiconductor element 14. Accordingly, the charging current can be rapidly extracted by the gate voltage control semiconductor element 14 without depending on the output impedance of an input circuit applying a voltage to the gate terminal 5 or the OFF-time voltage level of a signal applied to the gate terminal 5. Accordingly, it is possible to prevent the insulated-gate semiconductor element from being turned ON by mistake and it is possible to turn OFF the insulated-gate semiconductor element at a high speed.

In the background-art example described in JP-A-2012-34079, the pull-up element 25 is provided between the gate and the drain of the gate voltage control NMOSFET 14 so that it is possible to prevent the insulated-gate semiconductor element from being turned ON by mistake and it is possible to turn OFF the insulated-gate semiconductor element at a high speed.

However, in the background-art example described in JP-A-2012-34079, the depletion-type MOSFET is used as the pull-up element. A back gate terminal of the depletion-type MOSFET is connected to a source terminal of the same MOSFET.

It will go well in the case where, of the elements constituting the semiconductor integrated circuit device 1, the N-type depletion MOSFET 25 and the depletion MOSFET 12$x$ are constituted by individual (discrete) semiconductors separately, but there may arise a problem when these depletion MOSFETs are to be formed in the same semiconductor substrate as the other constituent elements of the semiconductor integrated circuit device 1. That is, consider that the power MOSFET (insulated-gate semiconductor element) 8, the gate voltage control NMOSFET (gate voltage control semiconductor element) 14, the N-type depletion MOSFET 25 as the pull-up element, and the N-type enhancement MOSFET 12z constituting the logic circuit (threshold control circuit) 12 are formed in one and the same N-type substrate. In this case, the insulated-gate semiconductor element 8 may be formed as a vertical type in an N-type substrate 100, the gate voltage control NMOSFET (gate voltage control semiconductor element) 14 and the N-type enhancement MOSFET 12z constituting the logic circuit 12 may be formed in a common p-type region (p-well) 101 and the pull-up element 25 constituted by the depletion-type MOSFET may be formed in an independent p-type region (p-well) 102 formed at a predetermined distance from the common p-type region (p-well) 101, as shown in FIG. 13.

With the configuration made thus, a parasitic PNP-type transistor is formed among the common p-type region 101, the independent p-type region 102 and the N-type substrate 100. For this reason, there is a possibility that the parasitic PNP-type transistor may operate to change the independent p-type region 102 into the ground potential when the power MOSFET (insulated-gate semiconductor element) 8 is turned ON to decrease the potential of the N-type substrate 100. In addition, when the potential of the N-type substrate 100 is low, electric charges in a source electrode (directly connected to the p-well region 102 by wiring) of the depletion-type MOSFET 25 constituting the pull-up element leak to the N-type substrate 100 through a PN-junction formed between the independent p-well region 102 and the N-type substrate 100. Thus, there may arise a problem that the gate voltage control semiconductor element cannot be pulled up excellently.

SUMMARY

Accordingly, the invention has been accomplished with attention focused on the foregoing problems inherent in the background-art examples. An object of the invention is to provide an insulated-gate type device driving circuit which can excellently perform an operation to pull up a gate voltage control semiconductor element in order to prevent an insulated-gate type device from being turned ON by mistake and turn OFF the insulated-gate type device at a high speed and which is suitable for integrating all constituent elements into one and the same semiconductor substrate.

In order to achieve the aforementioned object, according to an aspect of the invention about the insulated-gate type device driving circuit, there is provided an insulated-gate type device driving circuit for driving an insulated-gate semiconductor element based on a gate signal inputted from the outside, including: a gate voltage control semiconductor element which is connected between a gate and a source of the insulated-gate semiconductor element; and a pull-up element which is constituted by a depletion type MOSFET connected between a gate and a drain of the gate voltage control semiconductor element; wherein: the gate voltage control semiconductor element is driven by a voltage applied to the gate of the insulated-gate semiconductor element; and a back gate of the depletion type MOSFET constituting the pull-up element is grounded.

According to the invention, a charging current of a parasitic capacitance between the gate and a drain of the insulated-gate semiconductor element is used as a power source so that the gate voltage control semiconductor element can be turned ON by the pull-up element. Due to the configuration made thus, the charging current can be rapidly extracted by the gate voltage control semiconductor element without depending on the output impedance of an input circuit applying a voltage to the gate terminal or the OFF-time voltage level of the signal applied to the gate terminal. Accordingly, it is possible to prevent the insulated-gate semiconductor element from being turned ON by mistake and it is possible to turn OFF the insulated-gate semiconductor element at a high speed. In addition, since the insulated-gate semiconductor element is turned ON to extract the charging current, the chip size can be suppressed and the influence (current consumption or Ron) on a normal operation can be reduced.

Further, the back gate of the MOSFET constituting the pull-up element is grounded and separated from the source side of the same MOSFET. Thus, it is possible to eliminate formation of a parasitic PNP transistor in the N-type substrate, and it is possible to prevent electric charges from leaking through a PN-junction in the N-type substrate. It is therefore possible to provide a driving circuit suitable for being integrated into one and the same semiconductor substrate.

BRIEF DESCRIPTION OF THE DRAWINGS

FIGS. 2A to 2C are circuit diagrams showing the configurations of current detecting sensors.

DETAILED DESCRIPTION

An embodiment of the invention will be described below with reference to the drawings.

Figure 1:
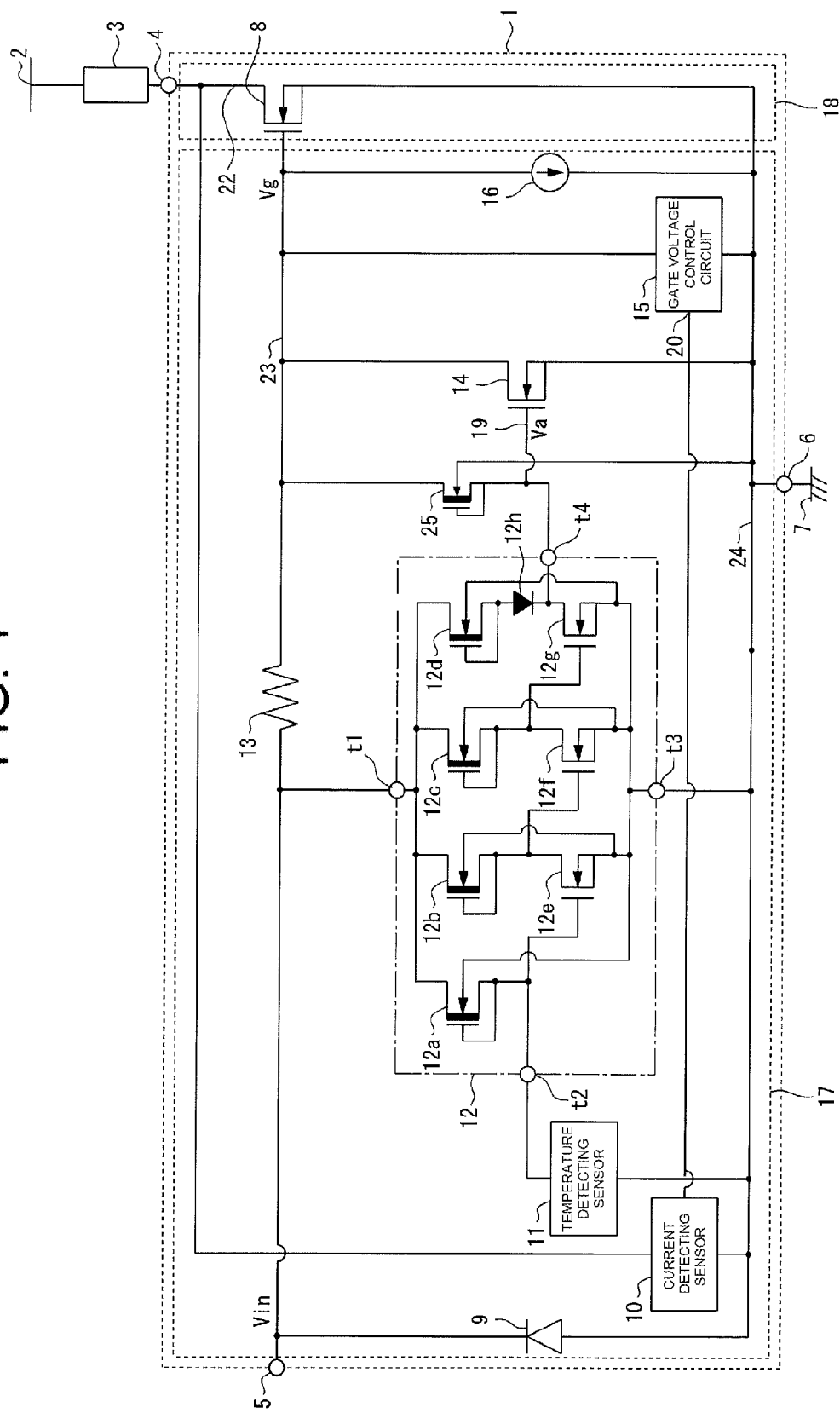
FIG. 1 is a circuit diagram showing the configuration of an insulated-gate type device driving circuit according to the invention.

A semiconductor integrated circuit device 1 to which an insulated-gate type device driving circuit according to the invention is applied is connected to one end of a load 3 such as a resistance load or an inductive load, while the other end of the load 3 is connected to a power supply 2, as shown in FIG. 1.

The semiconductor integrated circuit device 1 includes three terminals, i.e. a drain terminal 4, a gate terminal 5 and a source terminal 6. The drain terminal 4 is connected to the one end of the load 3. The source terminal 6 is connected to the ground. In addition, a gate signal is inputted to the gate terminal 5 from the outside.

The semiconductor integrated circuit device 1 is constituted by a drive circuit portion 17 and a power portion 18, which are formed in one semiconductor chip as will be described later. The power portion 18 is constituted by a power MOSFET 8 serving as an insulated-gate semiconductor element controllably turned ON/OFF by the drive circuit portion 17. A drain of the power MOSFET 8 is connected to the drain terminal 4. A gate of the power MOSFET 8 is connected to the gate terminal 5 through the drive circuit portion 17. A source of the power MOSFET 8 is connected to the source terminal 6 through the drive circuit portion 17.

A Zener diode 9 is connected between the gate terminal 5 of the semiconductor integrated circuit device 1 and a ground potential (source potential) 24.

In addition, a current detecting sensor 10 for detecting a drain current of the power MOSFET 8 is connected between a drain potential 22 and the ground potential 24 of the power MOSFET 8. For example, a sensor using resistance voltage division of resistors 10a and 10b as shown in FIG. 2A or a sensor using a current detecting MOSFET 10c or 10d as shown in FIG. 2B or 2C may be used as the current detecting sensor 10. Here, a back gate of each of the current detecting MOSFETs 10c and 10d is directly connected to the ground potential 24.

In addition, a threshold control circuit 12 is connected between the gate terminal 5 and the ground potential 24. For example, as shown in FIG. 1, this threshold control circuit 12 has a power supply terminal t1, a sensor terminal t2, a ground terminal t3 and a control terminal t4. The power supply terminal t1 is connected to a gate potential 23. A temperature detection signal of a temperature detecting sensor 11 is inputted to the sensor terminal t2. The ground terminal t3 is connected to the ground potential 24. The control terminal t4 is connected to a gate and a source of an MOSFET 25 which will be described later and to a gate of a gate voltage control NMOSFET 14 which will be described later.

In addition, the threshold control circuit 12 has four N-type depletion MOSFETs 12a to 12d and three N-type enhancement MOSFETs 12e to 12g. A drain of each of the N-type depletion MOSFETs 12a to 12d is connected to the power supply terminal t1. A drain of each of the N-type enhancement MOSFETs 12e to 12g is connected to source and gate terminals of corresponding one of the N-type depletion MOSFETs 12b to 12d. Source and back gate terminals of each of the N-type enhancement MOSFETs 12e to 12g are connected to the ground terminal t3.

Here, a gate and a source of the N-type depletion MOSFET 12a are connected to the input terminal t2. In addition, a gate of the N-type enhancement MOSFET 12e is connected to a connection point between the gate and the source of the N-type depletion MOSFET 12a and the input terminal t2. Further, a gate of the N-type enhancement MOSFET 12f is connected to a connection point between the N-type depletion MOSFET 12b and the N-type enhancement MOSFET 12e. Further, a gate of the N-type enhancement MOSFET 12g is connected to a connection point between the N-type depletion MOSFET 12c and the N-type enhancement MOSFET 12f.

A back gate of each of the N-type depletion MOSFETs 12a to 12d is connected to the ground potential 24 of the power MOSFET 8 through the ground terminal t3.

In addition, a diode 12h is inserted between the N-type depletion MOSFET 12d and the N-type enhancement MOSFET 12g. An anode of this diode 12h is connected to the gate and the source of the N-type depletion MOSFET 12d. A cathode of this diode 12h is connected to the drain of the N-type enhancement MOSFET 12g. A connection point between the diode 12h and the N-type enhancement MOSFET 12g is connected to the control terminal t4.

The diode 12h is provided so that a current flowing into the N-type depletion MOSFET 25 which will be described later can be prevented from flowing into the gate terminal 5 serving as a high potential side power source of the threshold control circuit 12 through the N-type depletion MOSFET 12d and the power supply terminal t1. That is, if the diode 12h is not provided, when the gate terminal 5 is at a low level and the gate potential 23 is at a high level, a current will flow through the N-type depletion MOSFET 12d so that a gate potential 19 of the gate voltage control NMOSFET 14 which will be described later cannot be raised.

In addition, a gate resistor 13 is connected between the gate of the power MOSFET 8 and the gate terminal 5. The power supply terminal t1 of the threshold control circuit 12 is connected between the gate resistor 13 and the gate terminal 5.

Figure 3:
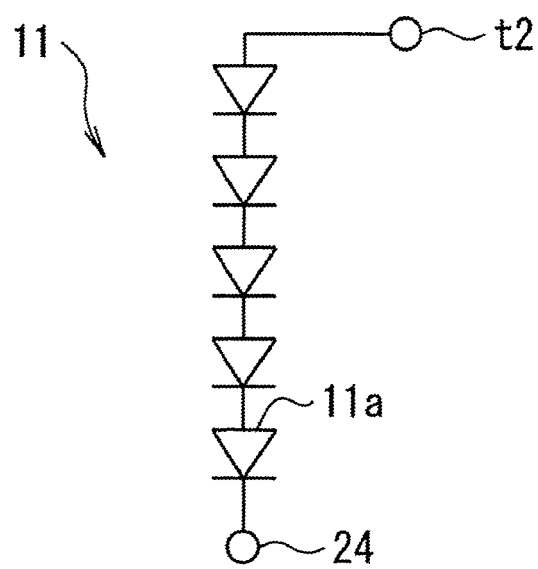
FIG. 3 is a circuit diagram showing the configuration of a temperature detecting sensor.

Further, the temperature detecting sensor 11 is connected to the sensor terminal t2 of the threshold control circuit 12. For example, a sensor using a temperature characteristic of a VF characteristic of each diode 11a shown in FIG. 3 may be used as the temperature detecting sensor 11.

Further, the gate voltage control NMOSFET 14 serving as a gate voltage control semiconductor element is connected between the gate potential 23 and the ground potential 24 of the power MOSFET 8. A drain of the gate voltage control NMOSFET 14 is connected to the gate potential 23. The gate of the gate voltage control NMOSFET 14 is connected to the control terminal t4 of the threshold control circuit 12. Further, a source and a back gate of the gate voltage control NMOSFET 14 are connected to the ground potential 24.

The N-type depletion MOSFET 25 serving as a pull-up element is connected between the drain and the gate of the gate voltage control NMOSFET 14. A drain of this MOSFET 25 is connected to the gate potential 23 between the gate resistor 13 and the gate voltage control NMOSTFET 14. In addition, the gate and the source of the MOSFET 25 are connected to each other and connected to a connection point between the gate of the gate voltage control NMOSFET 14 and the control terminal t4 of the threshold control circuit 12. A back gate of the MOSFET 25 is separated from the source of the MOSFET 25 and connected to the ground potential 24.

Figure 4C:
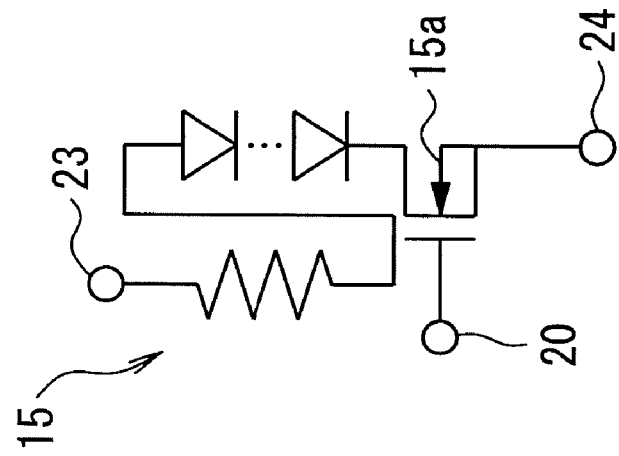
FIGS. 4A to 4C are circuit diagrams showing the configurations of gate voltage control circuits.
Figure 4B:
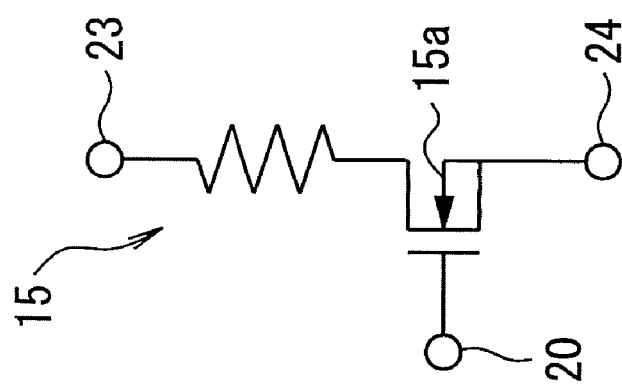
Figure 4A:
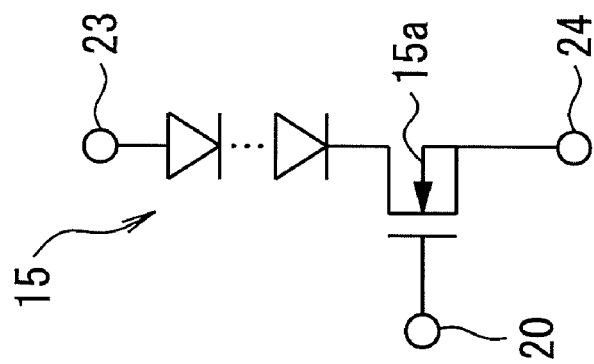

In addition, a gate voltage control circuit 15 is connected between the gate potential 23 and the ground potential 24. An input terminal of the gate voltage control circuit 15 is connected to an output terminal of the current detecting sensor 10. The gate voltage control circuit 15 may be formed as a series circuit of an NMOSFET 15a and diodes and/or a resistor as shown in any of FIGS. 4A to 4C.

Further, a constant current source 16 is connected between the gate potential 23 and the ground potential 24. This constant current source 16 is provided to pull down the gate potential 23 so that the power MOSFET 8 can be prevented from being turned ON due to noise going into the gate terminal 5 from the outside.

In addition to the function as a switching element for driving the load 3, the semiconductor integrated circuit device 1 also has an overcurrent detecting/protecting function for preventing the semiconductor integrated circuit device 1 itself from being damaged due to a large current flowing into the semiconductor integrated circuit device 1, for example, when the load 3 is short-circuited, and an overheat detecting/protecting function for preventing the semiconductor integrated circuit device 1 itself from being damaged due to heat generated by the large current.

The overcurrent detecting/protecting function is achieved by the current detecting sensor 10 and the gate voltage control circuit 15. The overcurrent detecting/protecting function will be described specifically below.

When an overcurrent flows between the drain terminal 4 and the ground terminal 6, an output of the current detecting sensor 10, i.e. a voltage of an input 20 of the gate voltage control circuit 15 increases. When the voltage of the input 20 of the gate voltage control circuit 15 is not lower than a predetermined voltage, the N-type enhancement MOSFET 15a of the gate voltage control circuit 15 shown in FIG. 4A, 4B or 4C turns ON. Thus, the gate potential 23 is decreased so that the current flowing between the drain terminal 4 and the ground terminal 6 can be limited.

The overheat detecting/protecting function is achieved by the temperature detecting sensor 11, the threshold control circuit 12 and the gate voltage control NMOSFET 14. The overheat detecting/protecting function will be described specifically below.

In accordance with a temperature rise, an output of the temperature detecting sensor 11, that is, an input voltage of the input terminal t2 of the threshold control circuit 12 decreases. When the voltage of the input terminal t2 of the threshold control circuit 12 is not higher than a predetermined voltage, a voltage Vin of the gate terminal 5 is applied to the gate of the gate voltage control NMOSFET 14 from the threshold control circuit 12. Thus, the gate voltage control NMOSFET 14 turns ON so that the gate potential 23 can be lower than a threshold voltage of the power MOSFET 8. In this manner, the semiconductor integrated circuit device 1 is turned OFF.

The overcurrent detecting/protecting function and the overheat detecting/protecting function operate with the voltage of the gate terminal 5 used as a power source and without requiring an external power supply. Thus, the semiconductor integrated circuit device in the embodiment can operate with the three terminals in the same manner as a single MOSFET. In addition, although it is typical that a gate protecting circuit is formed to be externally attached, the gate protecting circuit may be formed in the semiconductor integrated circuit device 1 so as to dispense with any externally attached elements. As a result, cost can be reduced and an occupation area can be reduced. Further, since various detecting circuits and the gate protecting circuit are mounted in one chip, chip cost can be reduced and an assembling process can be made simple.

In addition, a threshold determining function for determining a threshold voltage (reference voltage) VIN(th) of the semiconductor integrated circuit device 1 is achieved by the threshold control circuit 12 and the gate voltage control NMOSFET 14. This function is provided to make the gate potential 23 of the power MOSFET 8 lower than a threshold voltage of the power MOSFET 8 to prevent the power MOSFET 8 from turning ON unless a voltage not lower than the threshold voltage VIN(th) higher than the threshold voltage Vg(th) of the power MOSFET 8 is applied to the gate terminal 5. That is, a threshold voltage of the N-type enhancement MOSFET 12g of the threshold control circuit 12 is set as VIN(th).

Figure 5:
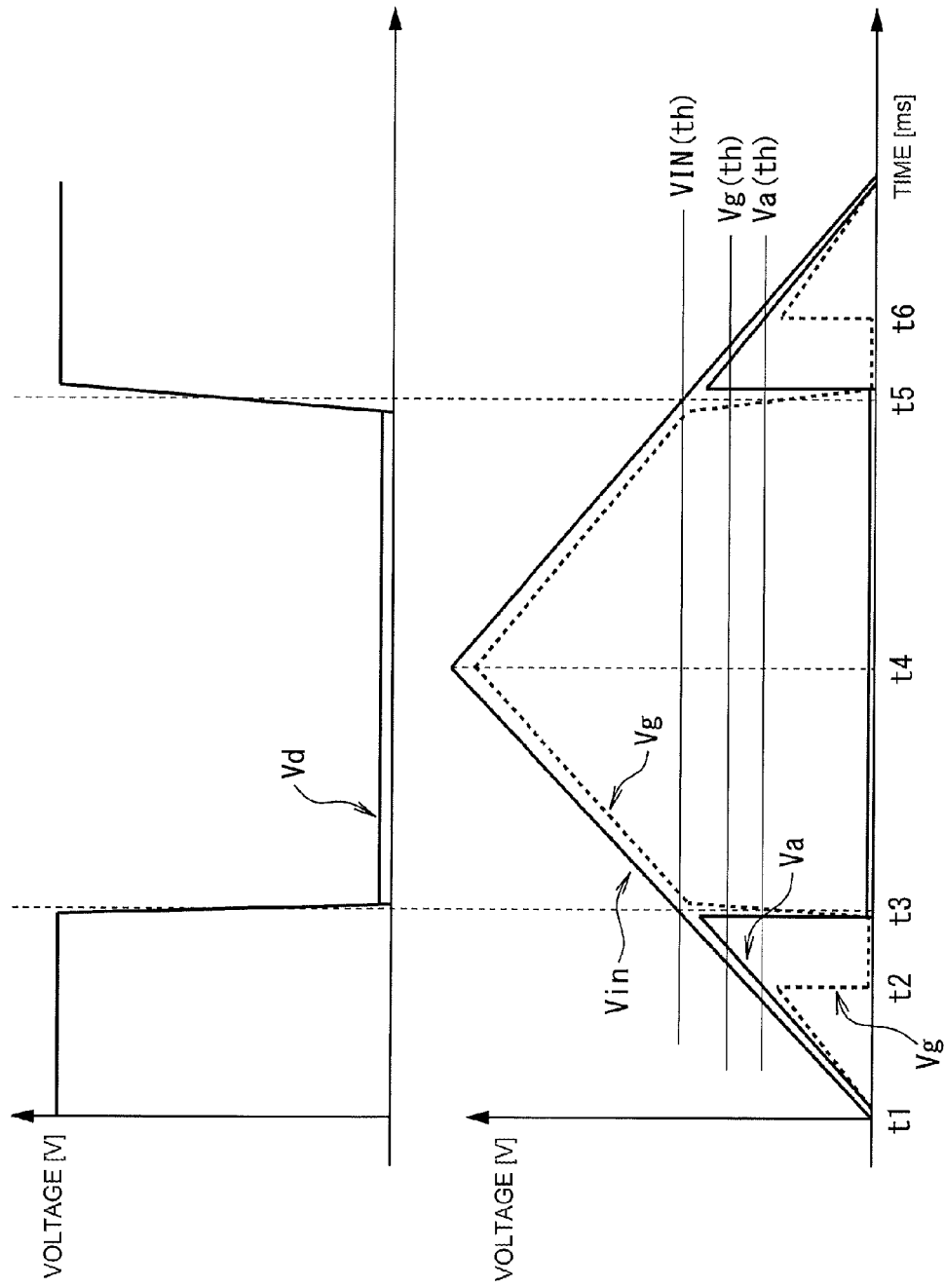
FIG. 5 is a timing chart showing a threshold determining function.

When a triangle wave is inputted as a gate signal to the gate terminal 5, a timing chart showing the threshold determining function is shown in FIG. 5. That is, when the voltage Vin of the gate terminal 5 begins to rise at a time instant t1, an output voltage (gate voltage of the gate voltage control NMOSFET 14) Va outputted from the control terminal t4 of the threshold control circuit 12 rises in accordance with the rise of the voltage Vin of the gate terminal 5.

The threshold control circuit 12 uses the voltage Vin of the gate signal as a power supply voltage. Accordingly, when the temperature detected by the temperature detecting sensor 11 is low, the voltage of the sensor terminal t2 arrives at a high level in accordance with the rise of the voltage Vin. Therefore, the N-type enhancement MOSFET 12e turns ON and the N-type enhancement MOSFET 12f turns OFF. As a result, the voltage Vin of the gate signal is applied to the gate of the N-type enhancement MOSFET 12g through the N-type depletion MOSFET 12d (the voltage between the source and the drain of the MOSFET 12d is negligible because the MOSFET 12d is of a depletion type). Accordingly, the N-type enhancement MOSFET 12g is kept at an OFF state unless the voltage Vin reaches the threshold voltage VIN(th) of the N-type enhancement MOSFET 12g.

Therefore, the voltage of the gate terminal 5 is applied to the gate of the gate voltage control NMOSFET 14 through the N-type depletion MOSFET 12d and the diode 12h. Accordingly, the gate voltage Va of the gate voltage control NMOSFET 14 is the same as the voltage Vin of the gate terminal 5. The gate voltage control NMOSFET 14 is turned OFF unless the time reaches a time instant t2. Accordingly, the gate potential 23 (Vg) of the power MOSFET 8 is equivalent to the voltage Vin of the gate terminal 5 (Vg=Vin).

When the gate voltage Va (=Vin) of the gate voltage control NMOSFET 14 then reaches a threshold voltage Va(th) of the gate voltage control NMOSFET 14 at the time instant t2, the gate voltage control NMOSFET 14 turns ON. Accordingly, the gate potential 23 (Vg) of the power MOSFET 8 becomes aground voltage (0[V]).

When the voltage Vin of the gate terminal 5 reaches the threshold voltage VIN(th) of the semiconductor integrated circuit device 1 which is the threshold voltage of the N-type enhancement MOSFET 12g of the threshold control circuit 12 at a time instant t3, the N-type enhancement MOSFET 12g turns ON. Therefore, the control terminal t4 of the threshold control circuit 12 is connected to the ground potential 24 through the N-type enhancement MOSFET 12g to become the ground voltage (0[V]). Accordingly, the gate voltage Va of the gate voltage control NMOSFET 14 becomes the ground voltage so that the gate voltage control NMOSFET 14 can turn OFF. Thus, the voltage Vin of the gate terminal 5 is applied to the gate of the power MOSFET 8. In this manner, the gate voltage control NMOSFET 14 can be controlled to be turned ON only when the voltage Vin of the gate terminal 5 is lower than the threshold voltage VIN(th).

The gate potential 23 (Vg) of the power MOSFET 8 exceeds the threshold voltage Vg(th) of the power MOSFET 8 at the time instant t3. Accordingly, the power MOSFET 8 changes over from OFF to ON at this time instant. Thus, the semiconductor integrated circuit device 1 is turned ON.

Since the relation Va(th)<Vg(th) is established thus, the gate potential 23 of the power MOSFET 8 can be controlled so that the threshold voltage VIN(th) of the semiconductor integrated circuit device 1 with respect to the input voltage Vin can be determined by the threshold control circuit 12.

In the embodiment, a current of the N-type depletion MOSFET 25 flows into the N-type enhancement MOSFET 12g of the threshold control circuit 12 in a normal operation time. Therefore, the size of the N-type depletion MOSFET 12d and the size of the N-type enhancement MOSFET 12g in the threshold control circuit 12 are set in consideration of this current so as to obtain a desired characteristic.

An element structure of the semiconductor integrated circuit device 1 will be described below with reference to FIG. 6.

Figure 6:
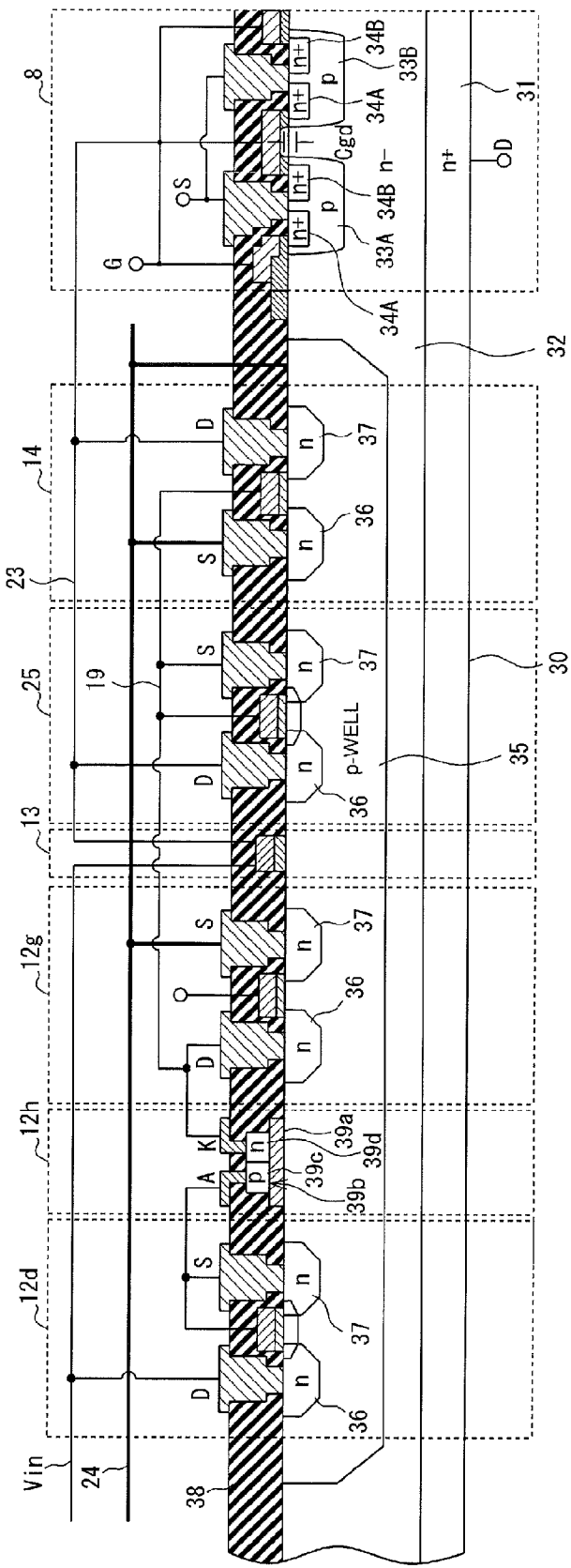
FIG. 6 is a sectional view showing an element structure of semiconductor elements including a power MOSFET.

FIG. 6 is a view showing an example of the element structure of the semiconductor integrated circuit device 1. In FIG. 6, the drain terminal, the source terminal and the gate terminal of the power MOSFET 8 are indicated as D, S and G respectively.

As shown in FIG. 6, the power MOSFET 8 has a vertical structure in which two low-concentration p-type regions (p-wells) 33A and 33B are formed in a front surface side of an $n^-$ epitaxial layer 32 formed on an $n^+$ substrate 31 constituting an N-type substrate 30, and two high-concentration n-type regions 34A and 34B are formed in each of these p-type regions (p-wells) 33A and 33B in a double-diffusion manner. A relatively large parasitic capacitance Cgd is formed between the gate and the drain of the power MOSFET 8. Incidentally, the reference numeral 38 designates an insulating film which is, for example, made of BPSG (Boron Phosphor Silicate Glass) and which is formed on the N-type substrate 30.

On the other hand, the N-type depletion MOSFET 12d and the N-type enhancement MOSFET 12g of the threshold control circuit 12, the gate resistor 13, the N-type depletion MOSFET 25 serving as a pull-up element, and the gate voltage control NMOSFET 14 are formed in the named order in a common low-concentration p-type region (p-well) 35 formed in the $n^-$ epitaxial layer 32 of the N-type substrate 30 because the back gate of the N-type depletion MOSFET 12d and the back gate of the N-type depletion MOSFET 25 are connected to the ground potential 24. Here, two n-type regions 36 and 37 constituting the drain and the source of each of the MOSFETs 14, 12d, 12g and 25 respectively are formed in the common p-type region (p-well) 35. In addition, a polysilicon diode serving as the diode 12h is connected between the N-type depletion MOSFET 12d and the N-type enhancement MOSFET 12g. This polysilicon diode is formed to include a p-type region 39c and an n-type region 39d in polysilicon 39b formed on the N-type substrate 30 through an $SiO_2$ oxide film 39a. The oxide film 39a and the polysilicon 39b are covered with the insulating film 38.

The n-type region 36 serving as the drain of the N-type depletion MOSFET 25 is connected to the gate potential 23. The gate of the N-type depletion MOSFET 25, together with the source of the same MOSFET, is connected to the n-type region 36 serving as the drain of the N-type enhancement MOSFET 12g and connected to the gate of the gate voltage control NMOSFET 14. The gate potential 23 is connected to the gate of the power MOSFET 8.

Further, the n-type region 37 serving as the source of the N-type enhancement MOSFET 12g, the n-type region 36 serving as the source of the gate voltage control NMOSFET 14 and the p-type region 35 serving as the back gates of the respective MOSFETs 12d, 12g, 14 and 25 are connected to the ground potential 24.

In this manner, the N-type depletion MOSFETs 12a to 12d of the threshold control circuit 12 and the back gate of the N-type depletion MOSFET 25 are connected to the ground potential 24 in the embodiment. Accordingly, the MOSFETs 12d, 12g, 14 and 25 formed in the N-type substrate 30 can be formed in parallel with one another in the common p-type region (p-well) 35.

Figure 13:
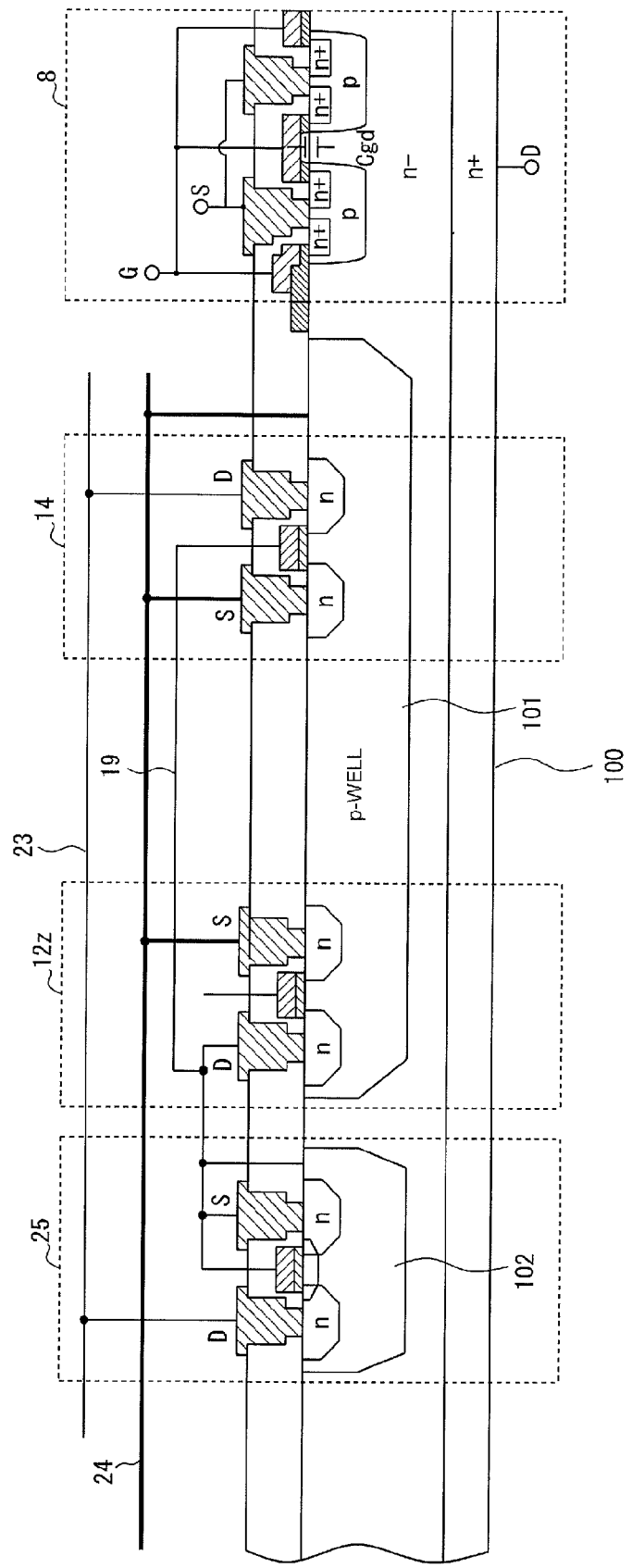
FIG. 13 is a sectional view showing an element structure of the insulated-gate type device driving circuit according to the background art.

Therefore, it is not necessary to form an independent p-type region (p-well) 102 in order to arrange the N-type depletion MOSFET 25 separately from an N-type enhancement MOSFET 12z of a threshold control circuit 12 as in the aforementioned background-art example shown in FIG. 13. Accordingly, it is possible to prevent a parasitic PNP transistor from being formed between the N-type depletion MOSFET 25 and the N-type enhancement MOSFET 12z of the threshold control circuit 12. In addition, the p-type region (p-well) 35 is connected to the ground potential 24. Accordingly, even when a PN junction is formed between the p-type region (p-well) 35 and the N-type substrate 30, a reverse voltage is applied so that electric charges in the source of the N-type depletion MOSFET 25 can be surely prevented from leaking to the N-type substrate 30.

Next, operation of the embodiment will be described with reference to FIG. 5, FIG. 6 and FIG. 7.

Assume now that a gate signal has been inputted to the gate terminal 5 of the semiconductor integrated circuit device 1 from the outside so as to turn ON the semiconductor integrated circuit device 1. On this occasion, when it is assumed that a triangle wave has been inputted as the gate signal as shown in FIG. 5, the gate potential 23 (Vg) is lower than the threshold voltage of the power MOSFET 8 unless the voltage of the gate terminal 5 reaches the threshold voltage VIN(th) of the semiconductor integrated circuit device 1 at the time instant t3, due to the aforementioned threshold determining function. Therefore, the power MOSFET 8 is kept at an OFF state till the time instant t3.

When the voltage Vin of the gate terminal 5 then reaches the threshold voltage VIN (th) at the time instant t3, the N-type enhancement MOSFET 12g of the threshold control circuit 12 turns ON. Thus, the gate voltage control NMOSFET 14 turns OFF and the voltage Vin of the gate terminal 5 at that time instant is applied to the gate of the power MOSFET 8. Thus, the power MOSFET 8 turns ON so that the semiconductor integrated circuit device 1 can be turned ON.

In the case where the semiconductor integrated circuit device 1 is changed over from an ON state to an OFF state, an OFF signal is inputted to the gate terminal 5 of the semiconductor integrated circuit device 1. That is, the voltage Vin of the gate terminal 5 is decreased on and after a time instant t4 in FIG. 5. Then, the gate voltage Vg of the power MOSFET 8 decreases accordingly.

When the voltage Vin of the gate terminal 5 is lower than the threshold voltage VIN(th) at a time instant t5, the N-type enhancement MOSFET 12g of the threshold control circuit 12 turns OFF. Thus, the voltage Vin of the gate terminal 5 at that time instant is applied to the gate of the gate voltage control NMOSFET 14 through the N-type depletion MOSFET 12d and the diode 12h.

On this occasion, the voltage Vin of the gate terminal 5 is not lower than the threshold voltage Va(th) of the gate voltage control NMOSFET 14. Accordingly, the gate voltage control NMOSFET 14 turns ON at the time instant t5. Thus, the gate voltage Vg of the power MOSFET 8 becomes the ground voltage so that the power MOSFET 8 can turn OFF rapidly. As a result, the semiconductor integrated circuit device 1 is turned OFF.

When the voltage Vin of the gate terminal 5 is then lower than the threshold voltage Va(th) of the gate voltage control NMOSFET 14 at a time instant t6, the gate voltage control NMOSFET 14 turns OFF so that the voltage yin of the gate terminal 5 can be applied to the gate of the power MOSFET 8. On this occasion, the gate voltage Vg of the power MOSFET 8 is lower than the threshold voltage Vg(th) of the power MOSFET 8. Accordingly, the power MOSFET 8 is kept at an OFF state. On and after the time instant t6, the gate voltage Vg of the power MOSFET 8 also decreases in accordance with the decrease of the voltage Vin of the gate terminal 5.

Next, description will be made in the case where the voltage of the power supply 2 increases suddenly when the voltage Vin of the gate terminal 5 is lower than the threshold voltage Va(th) of the gate voltage control NMOSFET 14 and the power MOSFET 8 is in an OFF state. Here, the state where the voltage of the power supply 2 increases suddenly may include changeover or surge of an upstream circuit of the load 3, start-up of the power supply 2, etc.

Figure 7:
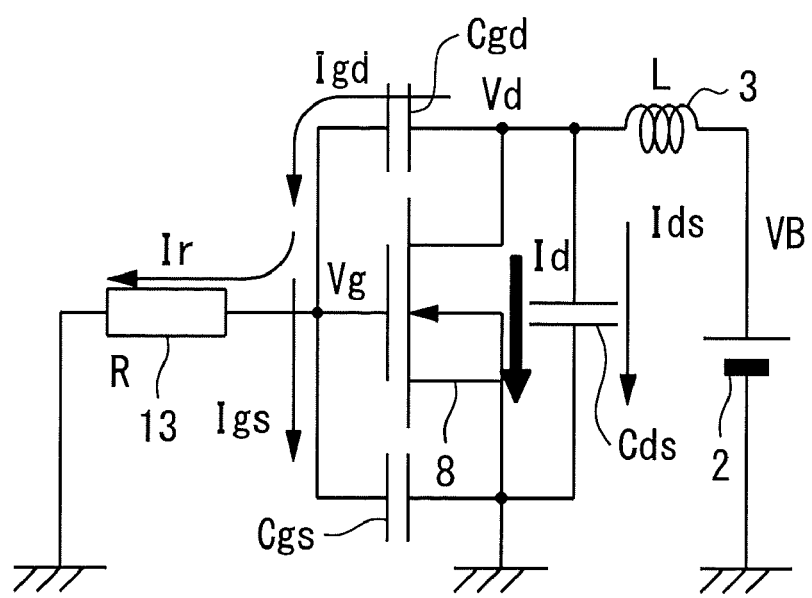
FIG. 7 is a circuit diagram showing the power MOSFET in a simplified model.

FIG. 7 is a circuit diagram showing the power MOSFET 8 in a simplified model. Regard the voltage Vin of the gate terminal 5 as the ground voltage (0[V]).

A parasitic capacitance Cgd is formed between the gate and the drain of the power MOSFET 8. A parasitic capacitance Cds is formed between the drain and the source of the power MOSFET 8. A parasitic capacitance Cgs is formed between the gate and the source of the power MOSFET 8.

When a power supply voltage VB is applied from the power supply 2 to the power MOSFET 8 through a load 3 (inductor L), a current Ids charging the capacitance Cds and a current Igd charging the capacitance Cgd flow. A part of the current Igd becomes a current Igs to charge the capacitance Cgs. The remaining current Ir is discharged through a gate resistor 13 (discharging resistor R). On this occasion, the gate voltage Vg of the power MOSFET 8 is equivalent to a charging voltage of the capacitance Cgs caused by the current Igs, and equivalent to a voltage drop Ir·R caused by the discharging resistor R.

Accordingly, when the power supply voltage VB increases suddenly in the case where the power MOSFET 8 is in an OFF state, a large current Igd charging the capacitance Cgd flows and a part of the current Igd serving as the current Ir flows through the discharging resistor R. Accordingly, the gate voltage Vg of the power MOSFET 8 is suddenly raised.

Figure 8:
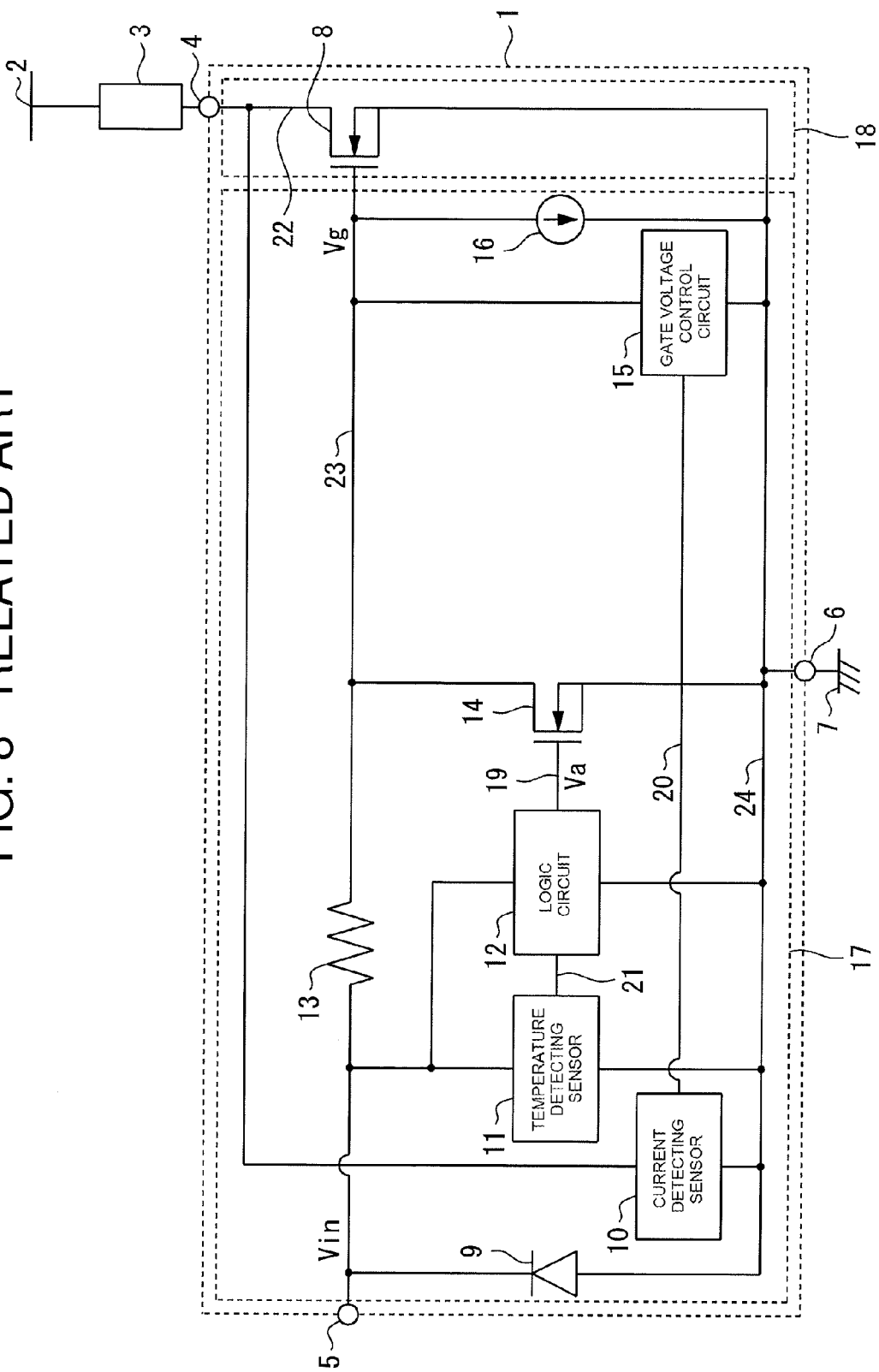
FIG. 8 is a circuit diagram showing the configuration of an insulated-gate type device driving circuit according to the background art, from which a pull-up element has been removed.

On this occasion, assume that the gate voltage control NMOSFET 14 is driven based on only the voltage of the gate terminal 5 as in a typical semiconductor integrated circuit device which is shown in FIG. 8 and which is not provided with the N-type depletion MOSFET 25 constituting a pull-up element. That is, assume that the gate voltage of the gate voltage control NMOSFET 14 is determined based on only the voltage of the gate terminal 5. In this case, when the voltage of the gate terminal 5 is lower than the threshold voltage Va(th) of the gate voltage control NMOSFET 14, the power supply voltage VB increases suddenly to raise the gate voltage Vg of the power MOSFET 8 to be not lower than the threshold voltage Vg(th) of the power MOSFET 8. In such a situation, the power MOSFET 8 temporarily changes over from an OFF state to an ON state because the gate voltage Vg of the power MOSFET 8 is not controlled by the gate voltage control NMOSFET 14.

Figure 9:
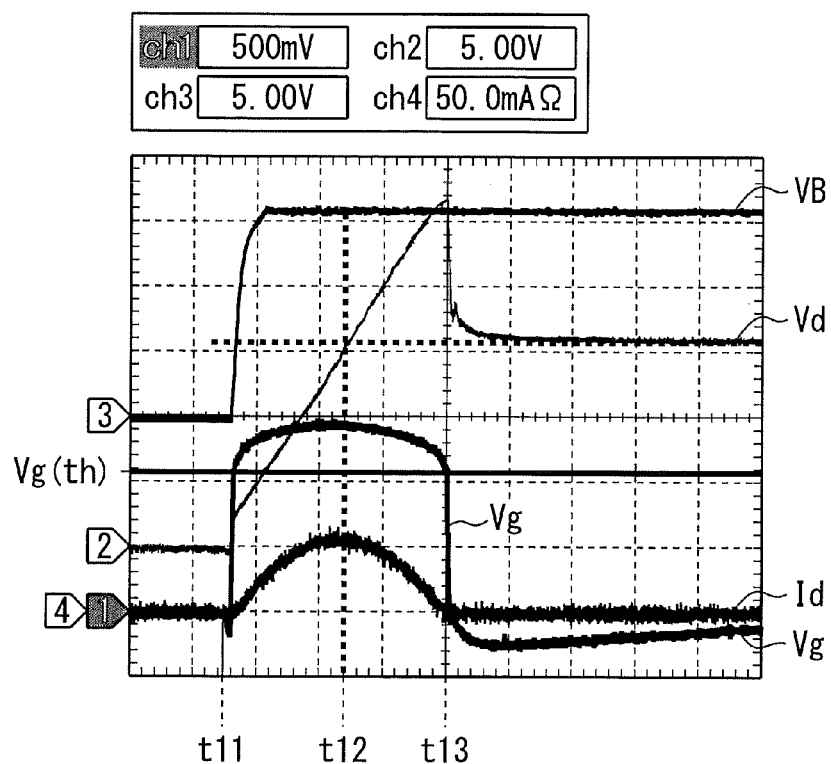
FIG. 9 is an explanatory view for explaining mistaken ON of a power MOSFET in the background-art example in FIG. 8.

FIG. 9 is a timing chart showing a state when the power MOSFET 8 turns ON by mistake.

Assume that the power supply voltage VB increases suddenly to raise the gate voltage Vg of the power MOSFET 8 to be not lower than the threshold voltage Vg(th) of the power MOSFET 8 at a time instant t11. Then, the power MOSFET 8 changes over from an OFF state to an ON state at the time instant t11.

On this occasion, a constant current flows into the capacitance Cgd. Accordingly, a voltage between opposite ends of the capacitance Cgd increases linearly. In addition, the gate voltage Vg is substantially constant to be the threshold voltage Vg(th) of the power MOSFET 8. Accordingly, a drain voltage Vd of the power MOSFET 8 also increases linearly in accordance with the increase of the voltage between the opposite ends of the capacitance Cgd (drain voltage Vd=gate voltage Vg+voltage between opposite ends of capacitance Cgd).

In a period of time between the time instant t11 and a time instant t12, the drain voltage Vd of the power MOSFET 8 is lower than the power supply voltage VB. In the period of time satisfying the relation Vd<VB, the relation d(Id)/dt=(VB−Vd)/L>0 is established and a current Id increases (inductance of the inductor L is also indicated as L.). When Vd is equal to VB at the time instant t12, the relation d(Id)/dt=0 is established, and then followed by the relation Vd>VB. Accordingly, the relation d(Id)/dt<0 is established and the current Id decreases. When Id is equal to 0 at a timing instant t13, the relation d(Id)/dt=0=(VB−Vd) is established. Accordingly, Vd becomes equal to VB (Even if Id is getting below 0 at the next moment, the gate voltage Vg decreases to be not higher than the threshold voltage Vg(th) to act in a direction to turn OFF the power MOSFET 8 immediately. Finally, Id becomes equal to 0. Incidentally, in FIG. 9, the position of reference potential (0[V]) in the waveform of the drain voltage Vd differs from that in the waveform of the power supply voltage VB. The value of the drain voltage Vd which becomes constant on and after the time instant t13 becomes the value of VB with respect to the waveform Vd.). On this occasion, Igd is equal to 0. Accordingly, the gate voltage Vg decreases rapidly so that the power MOSFET 8 can return to an OFF state.

When the power supply voltage VB increases suddenly in the case where the voltage of the gate terminal 5 is lower than the threshold voltage of the gate voltage control NMOSFET 14, the power MOSFET 8 temporarily changes over from an OFF state to an ON state.

Figure 10:
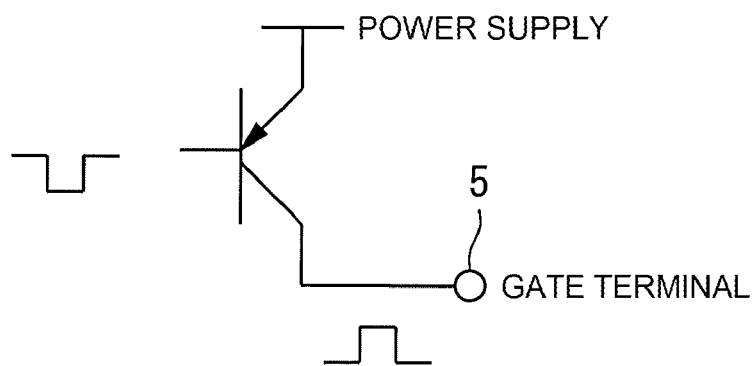
FIG. 10 is a circuit diagram showing the configuration of an input circuit.

Incidentally, description has been made here in the case where the voltage of the gate terminal 5 is lower than the threshold voltage of the gate voltage control NMOSFET 14. However, the same phenomenon occurs also in a state in which the gate terminal 5 is connected to a ground 7 through a high impedance element or in a state in which the gate terminal 5 is connected to an input circuit shown in FIG. 10.

Figure 11:
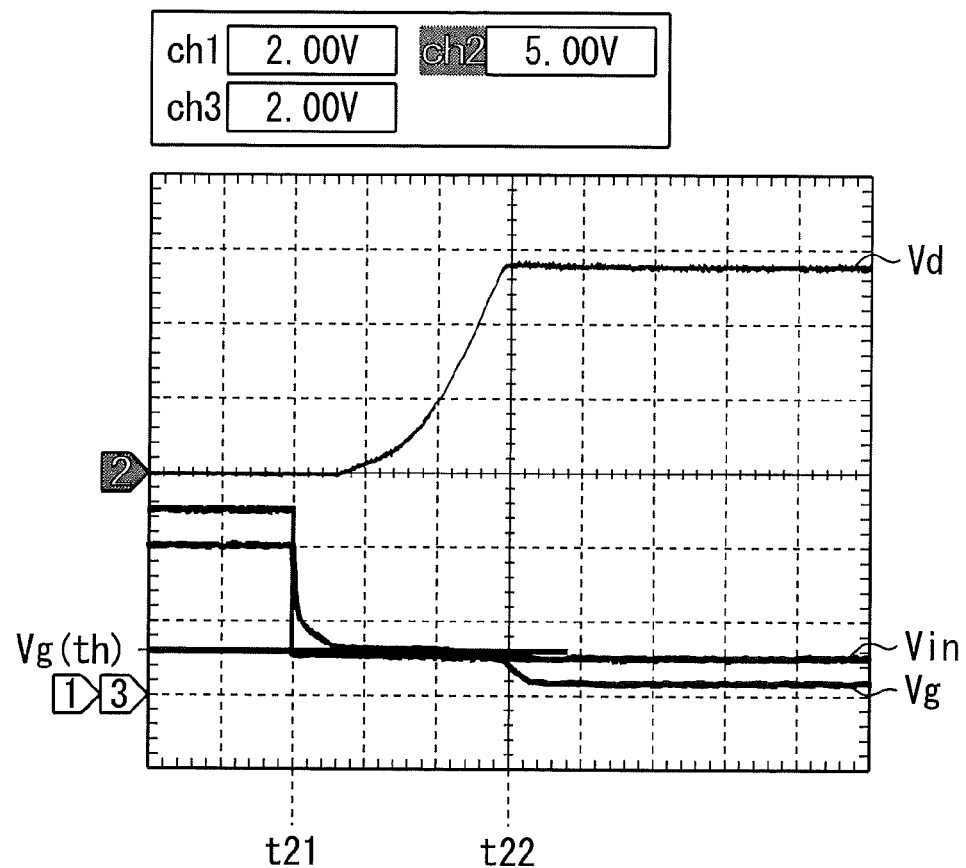
FIG. 11 is an explanatory view for explaining a turn-OFF operation of the power MOSFET in the background-art example in FIG. 8.
Figure 12:
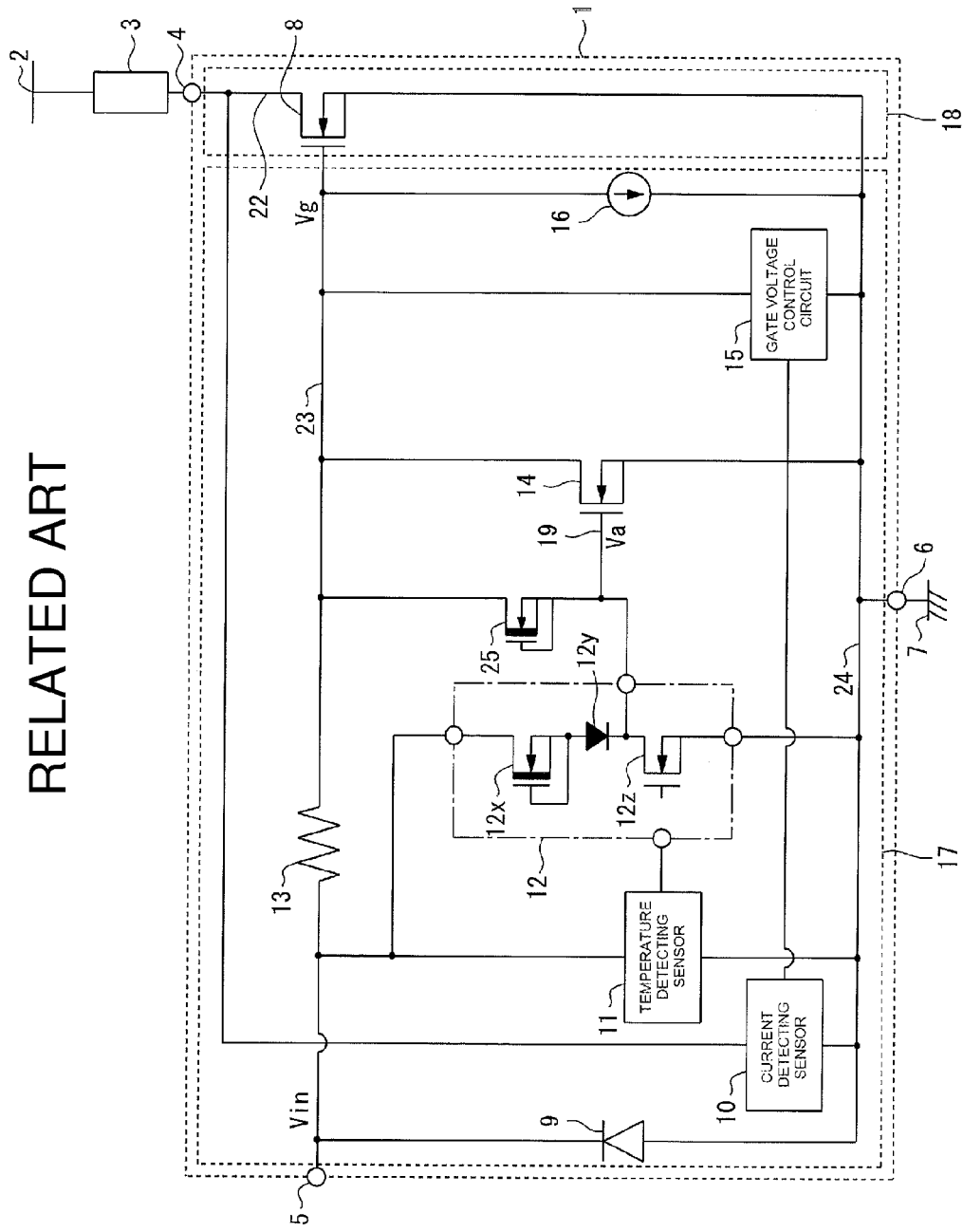
FIG. 12 is a circuit diagram showing the configuration of an insulated-gate type device driving circuit according to the background art.

In addition, when the power MOSFET 8 shifts from an ON state to an OFF state in a turn-OFF operation, a current Ir flows due to charging of a relatively large parasitic capacitance Cgd. As shown in FIG. 11, the gate voltage Vg is raised in a period of time between a time instant t21 and a time instant t22. Therefore, a turn-OFF time is elongated in the state in which the voltage of the gate terminal 5 at an OFF time is lower than the threshold voltage Va(th) of the gate voltage control NMOSFET 14. Incidentally, in FIG. 11, the position of the voltage Vin of the gate terminal 5 differs from the position of the reference potential (0[V]) of the gate voltage Vg (the voltage Vin is displayed to be slightly above the reference potential (0[V]) of the gate voltage Vg.).

On the other hand, in the embodiment, the gate voltage control NMOSFET 14 is driven by the gate voltage Vg of the power MOSFET 8 which increases due to the current Igd generated by the parasitic capacitance Cgd when the drain voltage Vd of the power MOSFET 8 shifts from a low level to a high level. That is, the gate voltage of the gate voltage control NMOSFET 14 is determined also based on the gate voltage Vg of the power MOSFET 8. With the configuration made thus, when the power supply voltage VB increases suddenly in the state where the voltage of the gate terminal 5 is lower than the threshold voltage of the gate voltage control NMOSFET 14, the gate voltage Vg of the power MOSFET 8 is raised to be not lower than the threshold voltage of the power MOSFET 8. Accordingly, the gate voltage control NMOSFET 14 changes over to an ON state.

For example, assume that the threshold voltage of the gate voltage control NMOSFET 14 is 0.6 V and the threshold voltage of the power MOSFET 8 is 1.2 V. On this occasion, when the gate potential 23 reaches at least 0.6 V due to a sudden increase of the power supply voltage VB as in the state at the time instant t11 in FIG. 9, the gate voltage of the gate voltage control NMOSFET 14 is raised to at least 0.6 V through the N-type depletion MOSFET 25 (the voltage Vin of the gate terminal 5 is so low that the gate voltage of the N-type enhancement MOSFET 12g is also low and the N-type enhancement MOSFET 12g is turned OFF.).

Accordingly, the gate voltage control NMOSFET 14 turns ON so that the current Ir caused by the capacitance Cgd can be extracted quickly. As a result, the gate potential 23 can be suppressed to be lower than the threshold voltage 1.2 V of the power MOSFET 8 to thereby prevent the power MOSFET 8 from being turned ON by mistake.

In addition, also in a turn-OFF operation, the current Ir caused by the parasitic capacitance Cgd at the turn-OFF time can be extracted rapidly in the same manner. Therefore, the turn-OFF operation can be performed at a high speed.

In the aforementioned embodiment, the gate voltage control NMOSFET is provided between the gate and the source of the power MOSFET, and the N-type depletion MOSFET is provided as the pull-up element between the gate and the drain of the gate voltage control NMOSFET. Configuration is made in such a manner that the gate voltage control NMOSFET is driven by the gate voltage of the power MOSFET.

Accordingly, when the voltage of the gate terminal of the gate voltage control NMOSFET is lower than the threshold voltage of the gate voltage control NMOSFET, that is, when the gate voltage control NMOSFET is in an OFF state, the power supply voltage may increase suddenly to raise the gate voltage of the power MOSFET. Even in such a case, the gate voltage control NMOSFET can be changed over to an ON state due to the gate voltage of the power MOSFET. As a result, the gate voltage of the power MOSFET can be decreased to keep the power MOSFET at an OFF state. Thus, it is possible to prevent the power MOSFET from being turned ON by mistake.

In addition, also in a turn-OFF operation, the gate voltage of the power MOSFET can be likewise decreased due to the gate voltage control NMOSFET. Accordingly, the power MOSFET can be turned off at a high speed.

Thus, even without depending on the voltage level of the gate signal applied to the gate terminal 5, the output impedance of an external input circuit applying a voltage to the gate terminal 5, etc., it is possible to prevent the power MOSFET from being turned ON by mistake when the power supply voltage increases suddenly, and it is possible to turn OFF the power MOSFET at a high speed.

Further, the gate voltage control NMOSFET is turned ON to decrease the gate voltage of the power MOSFET. Accordingly, the chip size can be reduced and the influence of the increase of current consumption, the decrease of electric conduction capacity of the power MOSFET (the increase of Ron), etc. on a normal operation can be suppressed.

In addition, the back gate of the N-type depletion MOSFET 25 constituting the pull-up element and the back gates of the N-type depletion MOSFETs 12a to 12d of the threshold control circuit 12 are grounded. Accordingly, in order to form the power MOSFET 8, the gate voltage control NMOSFET 14, the N-type depletion MOSFET 25, and the high-side N-type depletion MOSFETs and the low-side N-type enhancement MOSFETs of the threshold control circuit 12 into one chip in one N-type substrate 30 as shown in FIG. 6, the gate voltage control NMOSFET 14, the N-type depletion MOSFET 25, the N-type depletion MOSFETs and the N-type enhancement MOSFETs of the threshold control circuit 12 can be formed in parallel with one another in the common p-type region (p-well) 35 formed in the N-type substrate 30.

Therefore, it is not necessary to dispose the N-type depletion MOSFET 25 in the independent p-type region (p-well) 102 as in the case of FIG. 13 in which the source and the back gate of the N-type depletion MOSFET 25 are connected to each other. Accordingly, it is possible to surely prevent formation of a PNP transistor between the p-type region 102 which has a different potential from the ground potential 24 and in which the N-type depletion MOSFET 25 is formed and the p-type region (p-well) 101 adjacent to the p-type region 102 with interposition of an N-type region.

Further, the common p-type region (p-well) 35 is grounded. Accordingly, even when a PN junction is formed between the p-type region (p-well) 35 immediately under the depletion type MOSFETs 12a to 12d and 25 and the low-concentration n⁻ substrate 32, it is possible to surely prevent electric charges in the sources of the N-type depletion MOSFETs 12a to 12d and 25 from being extracted to the N-type substrate 30. Therefore, it is possible to accurately perform a pull-up operation achieved by the N-type depletion MOSFET 25 constituting the pull-up element.

Further, when the back gate of the N-type MOSFET 10c or 10d constituting the current detecting sensor 10 shown in FIG. 2B or 2C is separated from the source of the N-type MOSFET 10c or 10d and connected to the ground potential 24, the N-type MOSFET 10c or 10d can be formed integrally with the common p-type region (p-well) 35 formed in the aforementioned N-type substrate 30.

Incidentally, the aforementioned embodiment has been described in the case where the power MOSFET 8 is used as an insulated-gate semiconductor element. However, an IGBT (Insulated-Gate Bipolar Transistor) may be used instead.

Further, in the aforementioned embodiment, the constant current source 16 may be removed.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. An insulated-gate type device driving circuit for driving an insulated-gate semiconductor element based on a gate signal inputted from outside, comprising:
a gate voltage control semiconductor element which is connected between a gate and a source of the insulated-gate semiconductor element;
a pull-up element which is constituted by a depletion type MOSFET connected between a gate and a drain of the gate voltage control semiconductor element;
a threshold control circuit which controls driving of the gate voltage control semiconductor element based on the gate signal; and
a diode which prevents a current from flowing into a high potential side power supply of the threshold control circuit from the pull-up element;
wherein:
the gate voltage control semiconductor element is driven by a voltage applied to the gate of the insulated-gate semiconductor element;
a back gate of the depletion type MOSFET constituting the pull-up element is grounded; and
the threshold control circuit has a series circuit, which is connected between the gate and the source of the insulated-gate semiconductor element, of an N-type depletion MOSFET, a diode and an N-type enhancement MOSFET, and a connection point between the diode and the N-type enhancement MOSFET is connected to a connection point between the pull-up element and the gate voltage control semiconductor element.

2. The insulated-gate type device driving circuit according to claim 1, wherein:
the gate voltage control semiconductor element is in an OFF state when a voltage value of the gate signal is not smaller than a predetermined reference voltage higher than a threshold voltage of the gate voltage control semiconductor element, and the gate voltage control semiconductor element is controllably driven to be turned ON only when the voltage value of the gate signal is lower than the reference voltage.

3. The insulated-gate type device driving circuit according to claim 2, further comprising:
a current detecting portion which includes at least one MOSFET for detecting a current flowing into the insulated-gate semiconductor element and in which a back gate of the MOSFET is grounded.

4. The insulated-gate type device driving circuit according to claim 1, wherein:
the insulated-gate semiconductor element is formed as a vertical type in an N-type substrate, a p-type region is also formed in the N-type substrate, a depletion type MOSFET constituting the pull-up element is formed in the p-type region, and the p-type region is grounded.

5. The insulated-gate type device driving circuit according to claim 4, further comprising:
a current detecting portion which includes at least one MOSFET for detecting a current flowing into the insulated-gate semiconductor element and in which a back gate of the MOSFET is grounded.

6. The insulated-gate type device driving circuit according to claim 1, further comprising:
a current detecting portion which includes at least one MOSFET for detecting a current flowing into the insulated-gate semiconductor element and in which a back gate of the MOSFET is grounded.

7. A device, comprising:
an input node to connect to a gate signal;
an output node to supply a driving signal to a power semiconductor switching element;
a gate voltage control switching element coupled to the output node; and
a threshold control device to control switching of the gate voltage control switching element;
wherein the threshold control device includes a plurality of switch circuits coupled in parallel, each switch circuit including an enhancement semiconductor switching element coupled to a depletion semiconductor switching element,
each of the plurality of switch circuits being coupled to a control terminal coupled to the gate voltage control switching element; and
wherein control of the switching of the gate voltage control switching element by the threshold control device includes keeping the gate voltage control switching element in an ON state while a voltage of the gate signal is lower than a threshold voltage of the power semiconductor switching element.

8. The device of claim 7, further comprising a pull-up element coupled to the gate voltage control switching element.

9. The device of claim 8, wherein a back gate of the pull-up element, and each depletion semiconductor switching element of the plurality of switch circuits, are coupled to a ground potential.

10. The device of claim 7, wherein the threshold control device further includes a depletion semiconductor switching element having a terminal coupled to a gate of an enhancement semiconductor switching element of the plurality of switch circuits, and to a temperature detecting sensor.

11. The device of claim 7, wherein an enhancement semiconductor switching element and a depletion semiconductor switching element of the plurality of switch circuits include an N-type enhancement MOSFET and an N-type depletion MOSFET, respectively.

* * * * *